(12) United States Patent
Kwon et al.

(10) Patent No.: US 7,247,588 B2
(45) Date of Patent: Jul. 24, 2007

(54) ZIRCONIA TOUGHENED ALUMINA ESD SAFE CERAMIC COMPOSITION, COMPONENT, AND METHODS FOR MAKING SAME

(75) Inventors: Oh-Hun Kwon, Westboro, MA (US); Christophe Coureau, Marlboro, MA (US); Richard A. Gorski, Sterling, MA (US); Matthew A. Simpson, Sudbury, MA (US)

(73) Assignee: Saint-Gobain Ceramics & Plastics, Inc., Worcester, MA (US)

( * ) Notice: Subject to any disclaimer, the term of this patent is extended or adjusted under 35 U.S.C. 154(b) by 557 days.

(21) Appl. No.: 10/720,982

(22) Filed: Nov. 24, 2003

(65) Prior Publication Data

US 2006/0175584 A1    Aug. 10, 2006

Related U.S. Application Data

(60) Provisional application No. 60/428,402, filed on Nov. 22, 2002.

(51) Int. Cl.
*C04B 35/488* (2006.01)
*C04B 35/49* (2006.01)

(52) U.S. Cl. .................. 501/105; 501/127; 501/154
(58) Field of Classification Search ............ 501/127, 501/154, 105
See application file for complete search history.

(56) References Cited

U.S. PATENT DOCUMENTS

| | | |
|---|---|---|
| 3,502,597 A | 3/1970 | Bush |
| 4,772,576 A | 9/1988 | Kimura et al. |
| 5,445,776 A | 8/1995 | Honma et al. |
| 5,612,144 A | 3/1997 | Shinohara et al. |
| 5,688,731 A | 11/1997 | Chatterjee et al. |
| 5,830,816 A * | 11/1998 | Burger et al. .............. 501/105 |
| 5,830,819 A | 11/1998 | Shikata et al. |
| 5,958,813 A | 9/1999 | Aida et al. |
| 6,136,232 A | 10/2000 | Burlingame |
| 6,274,524 B1 | 8/2001 | Shinji et al. |
| 6,354,479 B1 | 3/2002 | Reiber et al. |
| 6,651,864 B2 | 11/2003 | Reiber et al. |
| 6,669,871 B2 | 12/2003 | Kwon et al. |
| 6,872,676 B2 | 3/2005 | Schaefer et al. |
| 2002/0086153 A1 | 7/2002 | O'Donnell, et al. |

FOREIGN PATENT DOCUMENTS

| | | |
|---|---|---|
| DE | 3743630 C1 | 3/1989 |
| JP | 3-005363 | 1/1991 |
| JP | 05109023 A * | 4/1993 |
| JP | 07097254 A * | 4/1995 |
| JP | 10-158060 | 6/1998 |

OTHER PUBLICATIONS

O'Bannon, Dictionary of Ceramic Science and Engineering, pp. 9, 142 and 282, 1984.*

(Continued)

*Primary Examiner*—David Sample
(74) *Attorney, Agent, or Firm*—Larson Newman Abel Polansky & White, LLP

(57) ABSTRACT

ESD safe ceramic component is provided which includes a sintered composition which is formed of a base material and a resistivity modifier. The base material includes a primary component and a secondary component, the primary component including $Al_2O_3$ and the secondary component including tetragonal-$ZrO_2$.

53 Claims, 2 Drawing Sheets

OTHER PUBLICATIONS

AJ Wallash, "Electrostatic Discharge (ESD) in Magnetic Recording: Past, Present and Future", Proc. of Understanding ESD in Magenetic Recording, IDEMA, pp. 3-20, 2000.

AJ Wallash, et al., "ESD Failure Mechanisms of Inductive and Magnitoresistive Recording Heads," EOD/ESD Symposium 95, pp. 322-330 (1990).

J. Elston, et al., "Study of High-temperature Electrical Properties of Zirconia and Lanthanum Chromite Sinters," Proceedings of a Symposium on Magnetohydrodynamic Electrical Power Generation, pp. 1601, 389-403 (1966).

C. Lam, "Characteriazation of ESD Tweezers of Use with Magnetoresistive Recording Heads", EOS/ESD Symposium 1996, pp. 14-21.

K. Kim, et al., "Advancements in Inherently Dissipative Polymer (IDP) Alloys Provide New Levels of Clean, Consistent ESD Protection", EOS/ESD Symposium 2000, pp. 132-138.

R. Wilhelm et al., "Iron Oxide-doped Yttria-Stabilized Zirconia Ceramic: Iron Solubility and Electrical Conductivity", AM. Ceram. Soc. Bull., vol. 58, No. 2, pp. 228-232, 1979.

N. Pratten, "Revew, The Precise Measurement of the Density of Small Samples", J. Material Sci., vol. 16, pp. 1937-1947 (1981).

ASTM: D257-93, "Standard Test Method for DC Resistance or Conductance of Insulating Materials."

FED. Test Method Std. No. 101, "Electrostatic Properties of Materials," Rev. B, Method 4046, Jan. 1969; Rev. C, Method 4046.1, Oct. 1982, Change Notice 1.

N. Joassen, "Static-Electric Characterization of Semi-Insulating Materials", EOS/ESD Symposium EOS-6, 1984.

G. Baumgartner, "Electrostatic Decay Measurement, Theory and Applications", EOS/ESD Symposium 1995, pp. 265-272.

M. Islam, et al., "Defect Chemistry of $LaBO_3$ (B=La, Mn or Co) Perovskite-type Oxides," J. Chem. Soc., Faraday Trans, 92930, pp. 479-482 (1996).

M. DeBarr et al., "Conduction Mechanism in the La(Al, Mn)3 System", Point Defects and Related Ceramics, Ed. T.O. Mason, et al., Ceramic Trans. vol. 24, Am. Ceram. Soc., pp. 229-238, 1991.

* cited by examiner

ZIRCONIA TOUGHENED ALUMINA ESD SAFE CERAMIC COMPOSITION, COMPONENT, AND METHODS FOR MAKING SAME

CROSS-REFERENCE TO RELATED APPLICATION(S)

The present application claims priority to U.S. Provisional Application No. 60/428,402, filed Nov. 22, 2002 and is incorporated herein by reference.

BACKGROUND

1. Field of the Invention

The present invention is generally related to electrostatic discharge (ESD) safe ceramic (sometimes "ESD dissipative ceramic," or "ESD ceramic") compositions, components, and methods for forming same, and in particular is drawn to ESD safe ceramic components based upon a zirconia toughened alumina (ZTA) material.

2. Description of the Related Art

In the area of electrostatic discharge (ESD) safe ceramics, various compositions have been developed in an attempt to bring together important electrical, thermal and mechanical properties of materials for end use applications that are sensitive to electrostatic discharge.

Most notably, zirconia-based materials have been investigated for use in environments sensitive to ESD. Generally speaking, zirconia is transformation-toughened, containing a stabilizer to partially stabilize the zirconia in a tetragonal crystal structure. Among various toughened zirconias, tetragonal partially stabilized zirconia has balanced properties including high strength, fracture toughness, corrosion resistance, and excellent machinability. For these reasons, tetragonal partially stabilized zirconia has been used for metal forming tools, blades/knifes, handling tools (e.g., tweezers), and optical fiber connectors (ferrules), and have found recent use replacing tool steels, stainless steels, special alloys and cemented tungsten carbides (WC).

However, because toughened alumina is an electrical insulator having a volume resistivity greater than $10^{12}$ Ohm-cm, it is not particularly suitable for ESD safe applications. In this regard, a technical background relating to the need for improved ESD materials can be found by reviewing publicly available information from the ESD association. See www.esda.org., for example.

Recently, a need has arisen in the art for ESD dissipative or ESD safe components which not only have desirable ESD properties, but which also have desirable thermal expansion properties, flexural strength, toughness, hardness, wear resistance, and other properties. Some of the demand is motivated by the need to find ESD safe materials which find use in certain demanding commercial applications such as bonding tips for microelectronic use, handling tools for magneto-resistive head fabrication, bonding capillaries, and similar applications. In this regard, zirconia based ceramics, including zirconia based ESD ceramics have been found to lack sufficient rigidity, stiffness, wear resistance, and abrasion resistance for certain demanding tool applications. In addition, it has also been found that zirconia based ESD ceramics may not have suitable thermal conductivity and thermal expansion properties.

Accordingly, based on the foregoing, the present inventors have recognized a need in the art for improved materials finding particular use in demanding applications, which require unique mechanical, structural and electrical properties.

SUMMARY

According to one aspect of the invention, an ESD safe ceramic component includes a sintered composition which is formed of a base material and a resistivity modifier. The base material includes a primary component and a secondary component, the primary component comprising $Al_2O_3$ and the secondary component comprising tetragonal-$ZrO_2$.

According to another feature of the present invention, a method for forming an ESD safe ceramic component is provided in which a ceramic body is densified at a relatively low temperature, such as less than about 1400° C. In this regard, the ceramic body is formed of a base material and a resistivity modifier, the base material including a primary component comprised of $Al_2O_3$ and a secondary component comprised of tetragonal-$ZrO_2$.

According to yet another feature of the present invention, a method for forming an ESD safe ceramic component is provided in which a base material and a resistivity modifier are mixed together, then formed into a ceramic body, which is then sintered. In this regard, the base material, in line with the foregoing description, includes $Al_2O_3$ and tetragonal-$ZrO_2$. Of significance, according to one aspect of the invention, the tetragonal-$ZrO_2$ contains a stabilizer which is present and pre-alloyed with the tetragonal-$ZrO_2$ prior to mixing with the resistivity modifier, and of course, prior to forming the ceramic body.

According to another aspect of the present invention, a method for forming an ESD safe ceramic component is provided in which a ceramic body is sintered including a base material and a resistivity modifier in line with the foregoing description, and thereafter, the resistivity is adjusted by an annealing operation.

According to another aspect of the present invention, an ESD safe ceramic bonding tool is formed from a sintered composition comprising a base material and a resistivity modifier. The base material is formed from zirconia toughened alumina, and the resistivity modifier is formed of a transition metal oxide. The tool has a density not less than about 98% of theoretical density and a volume resistivity within a range of about $10^6$ to about $10^9$ ohm/cm.

According to another aspect of the present invention, a method for forming a ceramic component is provided including hot isostatic pressing (HIPing) a ceramic body in a HIPing environment, the ceramic component being provided in a localized environment containing a processing gas species having a partial pressure greater than the partial pressure of the processing gas species in the HIPing environment. That is, the processing gas species is generally rich in the localized environment relative to the entire HIPing environment in which HIPing is carried out.

DESCRIPTION OF THE PREFERRED EMBODIMENT(S)

Figure 1:
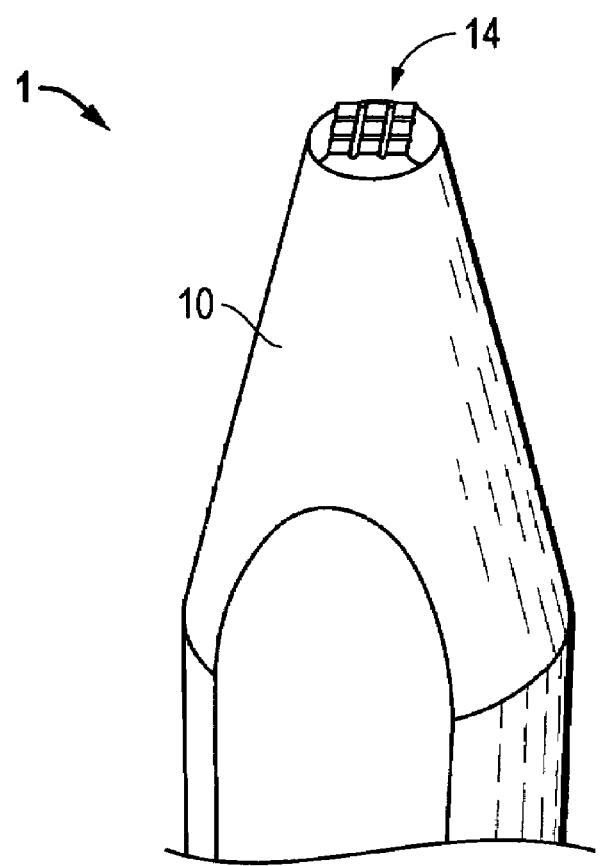
FIG. 1 is a perspective view of a bonding tool according to an embodiment of the present invention.

The subject matter of copending U.S. patent application Ser. No. 09/988,894, filed Nov. 19, 2001, commonly assigned to the present assignee, is incorporated herein by reference.

According to one aspect of the present invention, an ESD safe ceramic component is formed of a sintered composition which includes a base material and a resistivity modifier. In this regard, the base material is formed of a zirconia toughened alumina (ZTA). The zirconia toughened alumina includes a primary component of alumina ($Al_2O_3$) and a secondary component comprising zirconia ($ZrO_2$). $ZrO_2$, in general, includes at least three phases, including monoclinic, tetragonal, and cubic. Preferably, according to an embodiment of the present invention, the zirconia contains tetragonal zirconia, although monoclinic and cubic phases may be present. In this regard, in certain embodiments, a certain proportion of the monoclinic phase may be desirable for transformation toughening properties.

Typically the zirconia contains at least 75 vol % tetragonal zirconia, such as at least 85 vol % tetragonal zirconia. Since the tetragonal form of zirconia is generally considered unstable or metastable at room temperature, typically a stabilizer is present within the crystal structure, i.e., crystal lattice, of the zirconia material. The stabilizer can be chosen from one of numerous materials, including rare earth oxides such as yttria, ceria and/or scandia. While the level of the stabilizer relative to the zirconia varies depending upon the particular stabilizer utilized, typically the stabilizer is present within a range of about 1 to about 8 mol %, and more typically within a range of about 2 mol % to about 4.5 mol % with respect to the zirconia. According to one embodiment, the zirconia is stabilized prior to introduction with the resistivity modifier, and prior to formation of the ESD safe ceramic component. Introduction of the stabilizer or stabilizing agent at an early stage is generally referred to as "pre-alloying" the zirconia material. It may be desirable to execute pre-alloying of the zirconia in order to prevent unwanted chemical reactions during high temperature sintering operations. For example, such unwanted chemical reactions can cause undesirable changes in the mechanical, thermal and electrical properties of the component such as by adversely changing the resistivity of the component through formation of undesirable phases.

Turning to the base material, according to one embodiment of the present invention, more alumina is present than zirconia. The ratio of alumina to zirconia may be greater than 55:45, based on volume percent, such as not less than 60:40. Other embodiments include a higher proportion of alumina relative to zirconia, such as on the order of not less than 70:30, and 75:25.

Typically, the alumina in the form of the primary component of the base material forms a primary phase, sometimes understood in the art as a matrix phase of the base material. The secondary component, zirconia, in one embodiment is dispersed finely and evenly throughout the primary phase. As noted above, the secondary phase is formed of tetragonal zirconia. However, additional phases, such as monoclinic and cubic forms of tetragonal may also be present.

Turning the resistivity modifier, a resistivity modifier is utilized generally to decrease the volume and surface resistivity of the component. Most typically, the resistivity modifier is present within a range of about 5 to 40 vol % with respect to the base material. Depending upon the particular resistivity modifier used, narrower ranges may be also utilized, such as within a range of about 5 to about 30 vol %, or about 10 to 30 vol %. The resistivity modifier may increase or decrease the resistivity, but is typically employed to reduce the resistivity, both volume resistivity and surface resistivity of the component. In one form, the resistivity modifier takes on the form of a conductive particulate. Preferably, the modifier is not reactive with the alumina and/or zirconia. For example, ZnO can form non-conductive $ZnAl_2O_4$ (zinc aluminate) due to reaction with the alumina base material, and therefore is not desirable. The following is a list of resistivity modifiers which may be considered for use in connection with embodiments of the present invention.

Carbides ($B_4C$, SiC, TiC, $Cr_4C$, VC, ZrC, TaC, WC, graphite, carbon); Nitrides (TiN, ZrN, HfN); Borides ($TiB_2$, $ZrB_2$, $CaB_6$, $LaB_6$, $NbB_2$); Silicides ($MoSi_2$,); Carbonitrides (Ti(C,N), Si(CN)); Single oxides (NiO, FeO, MnO, $Co_2O_3$, $Cr_2O_3$, $Fe_2O_3$, $Ga_2O_3$, $In_2O_3$, $GeO_2$, $MnO_2$, $TiO_{2-x}$, $RuO_2$, $Rh_2O_3$, $V_2O_3$, $Nb_2O_5$, $Ta_2O_5$, $WO_3$); Doped oxides ($SnO_2$, $CeO_2$, $TiO_2$, ITO); Perovskites ($MgTiO_3$, $CaTiO_3$, $BaTiO_3$, $SrTiO_3$, $LaCrO_3$, $LaFeO_3$, $LaMnO_3$, $YMnO_3$, $MgTiO_3F$, $FeTiO_3$, $SrSnO_3$, $CaSnO_3$, $LiNbO_3$); Spinels ($Fe_3O_4$, $MgFe_2O_4$, $MnFe_2O_4$, $CoFe_2O_4$, $NiFe_2O_4$ $ZnFe_2O_4$, $CoFe_2O_4$, $CoFe_2O_4$, $FeAl_2O_4$, $MnAl_2O_4$, $ZnAl_2O_4$, $ZnLa_2O_4$, $FeAl_2O_4$, $MgIn_2O_4$, $MnIn_2O_4$, $FeCr_2O_4$, $NiCr_2O_4$, $ZnGa_2O_4$, $LaTaO_4$, $NdTaO_4$); Magnetoplumbite ($BaFe_{12}O_{19}$,); Garnet ($3Y_2O_3.5Fe_2O_3$); and Other oxides ($Bi_2Ru_2O_7$,).

Typically, the conductive particulate is chosen from a group consisting of oxides, carbides, nitrides, oxycarbides, oxynitrides, and oxycarbonitrides. Particularly suitable conductive particulates include transition metal oxides (including compound oxides) such as $TiO_2$, $MnO_2$, $Fe_2O_3$, CoO, NiO, SiC, $Cr_2O_3$, $SnO_2$, ZrC, $LaMnO_3$, BaO $6Fe_2O_3$, $LaCrO_3$, and $SrCrO_3$. Transition metal oxides such as $Fe_2O_3$, $TiO_2$ and $MnO_2$ are particularly suitable for use in connection with embodiments herein.

In forming the ceramic component, typically, the base material is in the form of zirconia toughened alumina, or as separate powders of alumina and zirconia which together form zirconia toughened alumina, are mixed with a resistivity modifier as described above. Mixing may be carried out by any one of conventional means, such as by mixing in an aqueous or organic solution to form a slurry in a device such as a jar mill. As is understood in the art, dispersants and other additives may be utilized, although typically no sintering aids are utilized. In this case, later stage sintering can be carried out by solid state diffusion, taking advantage of the solid solubility of the materials. The slurry may be used directly to form certain types of bodies, such as by slip casting or the like. Alternatively, the slurry may be dried into granules for later stage processing, such as shaping by pressing into a desired shape. At this stage, the shaped bodies are typically understood to be "green" in the form of green compacts or green ceramic bodies.

According to a particular feature of an embodiment of the present invention, sintering to densify the ceramic body is carried out at a relatively low temperature. Low temperature sintering is particularly desirable to prevent unwanted chemical reactions and formation of undesirable phases in the ceramic body. According to one feature of the present invention, the green body is sintered at a temperature not greater than about 1400° C., such as not greater than about 1350° C.

While sintering may be carried out under a pressureless sintering operation, such as under vacuum or atmospheric pressure in the presence of ambient air, or inert gases, sintering may also be carried out by hot pressing or hot isostatic pressing (HIP). Further, a combination of sintering operations may be utilized. According to one embodiment of the present invention, pressureless sintering is carried out to densify the ceramic body and achieve a density of at least 95% of theoretical density (T.D.). If needed by the final application of the component, the part may be further densified by exposure to a HIP process, such as at a temperature within a range of 1100° C. to about 1400° C. HIPing may be carried out as is understood in the art by use of a fluid, such as a gas or liquid. In one embodiment, an inert gas such as argon may be utilized to achieve a pressure above 100 MPa, such as on the order of 150–400 MPa.

Further, optionally, the characteristics of the ESD safe ceramic component may be fine-tuned by later stage processing. For example, the resistivity of the ESD safe ceramic component may be modified by a late stage process such as annealing. For example, components subjected to pressureless sintering and HIPing may be then heat treated in air at a temperature within a range of about 600° C. to about 1200° C. for a time period on the order of 0.5 to 100 hours, such as about 1 to about 5 hours, to reach a desired resistivity such as in a range within about $10^5$ to $10^{11}$ Ohm-cm. According to certain embodiments, the volume resistivity of the ESD safe ceramic component falls within a slightly narrower range, such as within a range of about $10^6$ to $10^9$ Ohm-cm.

According to embodiments of the present invention, desirable mechanical properties are achieved. For example, the ESD safe ceramic component may have a relatively high Young's Modulus, such as greater than about 230 GPa, and even greater than about 240 GPa. The hardness of the component may also be fairly high which contributes relatively high wear resistance, which is desirable for certain applications. For example, the Vickers Hardness may be greater than about 13 GPa, such as greater than about 14 GPa.

According to one embodiment, the component has a fairly fine crystal structure, namely having a grain size not greater than about 1 μm. It is noted that certain embodiments have a multi-phase structure, such as, including three main phases: zirconia, alumina, and resistivity modifier. The foregoing grain size is average grain size along a representative portion, including the main phases of the sample.

Further, according to certain embodiments of the present invention, the thermal expansion coefficient of the ESD safe ceramic component is relatively well matched for its intended environment. For example, for certain applications it is desirable for the thermal expansion coefficient to fairly closely match that of AlTiC substrates. In addition, certain ESD safe ceramic component may have thermal expansion coefficents that match well with commercially used tool steels and stainless steel, for example. Such thermal expansion matching may be effective to help prevent warping due to thermal stress during processing operations. In line with the foregoing, an embodiment of the present invention has a thermal expansion coefficient less than about $10.0 \times 10^{-6}$ $K^{-1}$. Further, the thermal expansion coefficient may be less than about $9.5 \times 10^{-6}$ $K^{-1}$. According to one embodiment, the thermal expansion coefficient is greater than about $8.0 \times 10^{-6}$ $K^{-1}$.

Further, according to another feature, the ESD safe ceramic component may have a relatively high density, such at least about 98% of theoretical density. Other embodiments are even denser, having a minimum density of 99%, and even 99.5% of the theoretical density.

In addition to desirably density, thermal expansion, and mechanical properties, embodiments also demonstrate desirable magnetic properties, as well as color, which is particularly important for some processing operations that rely on optical imaging components for process flow. For example, the certain embodiments have demonstrated a coercive magnetic field Hc not greater than about 5 E4 A/m, and component has a residual magnetic induction Mr of not greater than 10 Gauss. As to optical properties, the embodiments have been measured to have an L* not less than about 35.

The final geometric configuration of the ESD safe ceramic component may vary depending upon the intended use of the component. For example, the component may take on a form of wire bonding tips, wire bonding capillaries, magnetoresistive handling tools, substrates, carriers, slicing tools, dicing tools, de-gluing carrier tools, pick and place tools, semiconductor device packaging tools, single and two step probes, and test sockets. Embodiments of the present invention also call for using these tools in their intended environments, such as executing a wire bonding operation, handling MR heads, packaging IC devices and the like.

EXAMPLE 1

AZ67 powder, a ZTA (zirconia toughened alumina) with 20 vol. % Y-TZP and 80 vol.% $Al_2O_3$, available from Saint-Gobain Ceramics & Plastics in Colorado Springs, Colo., is mixed with submicron $Fe_2O_3$ in a jar mill. The mill is charged with Y-TZP milling media, deionized water, and dispersant. The milling was performed for 10 hours in order to assure a homogeneous mixing. The mixed slurry from the milling was dried using a Roto-Vap or spray dryer. It was found that a magnetic stirrer must be avoided in order to eliminate any segregation of slightly magnetic particles such as $Fe_2O_3$. The dried granules were pressed into disks or square tiles using steel molds followed by a CIPing (cold isostatic pressing) at 207 MPa (30,000 psi). These pressed parts of ~55% relative density ("or green compacts") were sintered at 1,200 to 1,400° C. for 1 hour in air using a furnace with moly-disilicide ($MoSi_2$) heating elements to achieve a sintered density of >95% T.D. (theoretical density), as summarized in Table 1. The T.D. of each composition was estimated by a rule of mixture assuming negligible reactions between phases. The density of sintered parts was measured by a water displacement method. Some sintered parts were further densified by HIPing (hot isostatic pressing) at 1,200–1,350° C. and for 45 min in argon pressure of 207 MPa to achieve substantially pore-free parts. The electrical surface resistance of sintered or HIPed parts were measured by the mean of a concentric probe per ESD S11.11. Some HIPed parts were heat treated in air at 700–950 C for 1–5 hrs to a desired ESD surface resistance, $10^5$–$10^{11}$ Ohm.

The Young's modulus (E) of HIPed parts was measured by a pulse-echo method to be ~270 GPa compared to ~200 GPa for Y-TZP based ESD safe ceramics.

The hardness of dense material was measured by Vickers hardness method using an indentation load of 1–5 Kgf and showed between 13–15 GPa compared to 10–12 GPa for Y-TZP based ESD safe ceramics.

Surprisingly, it was found that the sintering of desired mixture could be performed at a significantly lower temperature (e.g., lower than 1400° C., such as about 1,250° C.) than usual sintering temperatures. For instance, sintering temperatures of alumina, zirconia or ZTA are typically on the order of 1500° C., and even higher. The low temperature sintering is desirable for reduced reaction between dissimilar phases, reduced grain growth, and low densification cost. Further, it was found that a sintering at 1,400° C. or higher can result in a lower sintered density than at 1,250° C.

The results of resistivity measurements indicate that the desired ESD safe ZTA based ceramics can be prepared mixing alumina into ESD safe Y-TZP compositions.

EXAMPLE 2

AZ93 powder, a ZTA (zirconia toughened alumina) with 40 vol. % Y-TZP and 60 vol. % $Al_2O_3$, available from Saint-Gobain Ceramics & Plastics in Colorado Springs, Colo., is mixed with submicron $Fe_2O_3$ in a jar mill. The rest of processing method is same as Example 1. The results indicate that the ESD safe ZTA based ceramics an also be prepared with AZ93 powder.

carried out on near-net shaped components that were of a generally fine scale, such as those demanded in the microelectronic fabrication industry. One such example is the so-called bonding tool notably including a wire-bonding tip and capillary.

The bonding tip may be advantageously formed from cylindrical rods having a generally fine structure, typically having a diameter on the order of 2 mm nominally 1.6 mm. The rods may have a generally high aspect ratio, such as greater than about 3:1, 5:1 or even greater than about 10:1. The aspect ratio is defined as the ratio of the length to the next largest dimension of the component, and in the case cylindrical rods, the next largest dimension is the diameter. Such rods or rod stocks may be formed in a green state by an extrusion process or injection molding. It was discovered that following HIPing in argon that the properties of the rods undesirably changed. In particular, the rods emerged from HIPing having a darker color a lowered resistivity, typically on the order of $5 \times 10^4$ ohm/cm (as contrasted with $5 \times 10^6$ ohm/cm), suggesting a thermochemical reduction of $Fe_2O_3$ (hematite) into $Fe_2O_4$ (magnetite), and FeO, and subsequent reaction with Al2O3. That is, the $Fe_2O_3$ resistivity modifier

TABLE 1

Densification and Resistivities of ZTA based ESD dissipative ceramics before and after heat treatment

| | ZTA type | Fe2O3 (vol %) | Sintering temp (° C./Hr) | Sintered density (% TD) | Sintered surface resistance (Ohm)[1] | HIPed temp (° C.) | HIPed density (% TD) | HIPed surface resistance (Ohm)[1] | Heat Treatment in air (° C./Hr) | Surface Resistance after HT (Ohm)[1] |
|---|---|---|---|---|---|---|---|---|---|---|
| 1 | AZ67 | 18.6 | 1200/1 | 86* | | | | | | |
| 2 | AZ67 | 18.6 | 1250/1 | 99.6 | 1.52E11 | 1200 | 100 | 6.04E9 | | |
| 3 | AZ67 | 23.3 | 1250/1 | 99 | 7.28E10 | 1200 | 100 | 3.45E7 | | |
| 4 | AZ67 | 23.3 | 1400/1 | 96 | 1.3E5 | 1350 | 96.5 | 2.51E4 | 700/2 | 6.94E4 |
| 5 | AZ67 | 28.4 | 1250/1 | 99 | 1.77E6 | 1200 | 100 | 6.50E3 | 850/12 | 1.40E6 |
| 6 | AZ67 | 28.4 | 1300/1 | 98 | 4.23E5 | | | | 850/30 | 2.29E7 |
| 7 | AZ93 | 21.25 | 1250/1 | 98.9 | 1.19E11 | 1200 | 99.7 | 1.80E10 | | |
| 8 | AZ93 | 21.25 | 1400/1 | 97 | 9.3E4 | 1350 | 97.3 | 1.40E4 | 850/7 | Cracked |
| 9 | AZ93 | 25 | 1250/1 | 99 | 2.13E7 | 1200 | 99.52 | 5.12E4 | 700/12 | 8.5E7 |
| 10 | AZ93 | 23.3 | 1250/1 | 98.6 | 1.00E7 | 1200 | 99.98 | 1.70E5 | | |
| 11 | AZ93 | 23.3 | 1250/1 | 97.6 | 6.4E7 | 1200[2] | 99.95 | 5.00E6 | | |

*open porosity
[1]per ESD S11.11
[2]HIP with oxygen generating powder bed

According to yet another aspect of the present invention, a method for forming ceramic components includes hot isostatic pressing (HIPing) a ceramic body in a HIPing environment, the ceramic component being provided in a localized environment containing a processing gas species having a partial pressure greater than a partial pressure of the processing gas species in the HIPing environment. While description herein relates to ESD safe ceramics, and more particularly, to ZTA-based ESD safe ceramics, the foregoing method is particularly suitable for other ceramics, particularly those that benefit from a localized environment during HIPing.

According to a particular feature, HIPing of certain ceramic components may be advantageously carried out by utilizing a localized environment. In the context of ZTA-based ESD safe ceramics, it was found that certain geometries might be subject to unwanted chemical reactions during HIPing, even when utilizing an inert gas such as argon. In particular, additional testing beyond creation of relatively large scale working samples such as tiles was is reduced during HIPing. The samples also showed appreciably lower Vickers hardness indicting residual porosity after HIPing, as well as ferromagnetism.

Oftentimes, standard HIPing processes take place in an environment that has a low oxygen partial pressure, such on the order of $10^{-12}$ bar, while the HIPing environment is principally made up of non-reactive gases, such as inert or noble gases. A common gas is argon. One potential approach of addressing the problems associated with reduction of resistivity modifiers such as transition metal oxides (as demonstrated by the reduction of $Fe_2O_3$), would be to oxygen-HIP the ceramic components. However, oxygen-HIPing is not particularly cost effective, generally requiring the use of platinum lined thermal shields in an air or oxygen-containing atmosphere.

According to an embodiment, processing was carried out with a localized processing gas, notably oxygen, the processing gas being generally confined to a specific volume within the HIPing environment generally surrounding the ceramic components undergoing processing. This approach is effective to attenuate reduction of transition metal oxides, including $Fe_2O_3$, $TiO_2$ and $MnO_2$, which would otherwise reduce in the extremely low oxygen partial pressure associated with traditional HIPing processes. Attenuation of reduction of such oxides generally results in lowered residual porosity and damage such as bloating, cavity formation, and cracking. In addition, the electrical resistivity properties of the before-HIPed components are generally preserved post-HIPing.

As to the creation of the localized environment, various approaches may be utilized. According to one approach, the components undergoing HIPing are provided in a crucible, a refractory container in which work pieces are set for thermal processing. The crucible can contain a processing gas source, and defines therein the localized environment. The processing gas source is generally one that releases a desired gaseous species, creating a localized rich area. In the context of prevention of reduction of resistivity modifiers such as transition metal oxides, an oxygen gas sources is provided. The oxygen gas source may be desirably provided in powder form, which has relatively high surface area further promoting release of the desired processing gaseous species. In this regard, the components undergoing HIPing may be placed on a powder bed or embedded within a powder bed formed of the gas source.

In the context of oxygen-releasing sources, it is preferable that the processing gas source undergoes reduction to establish a desirable oxygen partial pressure within the localized environment, before any appreciable reduction of the ceramic component. The processing gas source generally undergoes reduction more easily than the resistivity modifier. This ease of reduction is a function of the free energy change of thermochemical reduction and oxidation as a function of temperature and may be determined by thermodynamic data from the Ellingham diagram which is provided, for example, in R. A. Swalin, Thermodynamics of Solids, $2^{nd}$ Edition, Wiley-Interscience Publications, pages 114 (1972), hereby incorporated by reference. In a way, the powder acts as a sacrificial HIPing agent undergoing reduction prior to any appreciable reduction of the ceramic component, thereby creating the desired localized environment and protecting the ceramic component. Generally, the localized oxygen partial pressure is greater than the equilibrium oxygen partial pressure of the HIPing environment at a given temperature and pressure of the system. Desirably, the partial pressure of oxygen is not less than about 0.1 atm in the localized environment and in some embodiments, not less than 0.5 atm. In contrast, the HIPing environment has a reduced partial pressure of oxygen, such as on the order of $10^{-10}$ and lower.

In the context of providing a stable localized environment, applicants have utilized various configurations of crucibles having a configuration that minimizes gas flow therethrough during HIPing to stably contain the localized oxygen rich environment, and to prevent the processing gas species from appreciably escaping the crucible and contaminating the HIPing environment. In particular, it is generally desirable to provide a crucible, which has only a single opening, to attenuate convective flow of gases therethrough. In addition, a gettering species may be provided in the opening, or adjacent the opening to getter the processing gas species that would otherwise escape into the HIPing environment. For example, in the case of oxygen processing gas species, the getterer may be a metal that oxidizes in the high temperature HIPing environment upon contact with the oxygen from the gas source.

The following examples illustrate various working embodiments of various components, notably including the formation of ceramic components by HIPing having a localized environment.

EXAMPLE 3

A ZTA (AZ93 available from Saint-Gobain Ceramics & Plastics in Colorado Springs, Colo., 40 vol % Y-TZP, 60 vol % $Al_2O_3$) was mixed with milled $Fe_2O_3$ powder (milled to a specific surface area of 13 $m^2/g$, Alpha Aesar of Ward Hill, Mass.) in water by milling with zirconia (Y-TZP) milling media, followed by spray drying. The spray-dried powder was pressed into rectangular tiles using a steel mold followed by CIPing at 207 MPa to a green density ~55% T.D.

The CIPed tiles was sintered at 1250° C. for 1 hr in air to a sintered density of ~98% T.D. The color of sintered tiles was red. The tiles were not attracted to a permanent magnet. The resistivity of material by the DC resistivity measurement was ~$5 \times 10^7$ $\Omega$-cm, which is good for the ESD dissipation.

Sintered samples were HIPed in nested alumina crucibles filled with zirconia (Y-TZP) bubbles and with an oxygen-generating oxide powder ($Pr_6O_{11}$, $MnO_2$, or CoO) bed on bottom. Some samples were HIPed without the oxygen-generating powder. The HIPing was performed at 1200° C. in argon pressure of 207 MPa with graphite heating elements.

A few oxygen-generating powders were used and found effective. For instance, $Pr_6O_{11}$, $MnO_2$, and CoO powders are thermochemically reduced more easily compared to $Fe_2O_3$, and thus are effective to prevent or attenuate the reduction of $Fe_2O_3$ into $Fe_3O_4$. Generally speaking, the oxygen-generating powders are chosen from those that undergo reduction before reduction of the resistivity modifier during processing.

Most samples HIPed with the oxygen-generating powders showed the same color after the HIPing with the density mostly higher than 99.8%, and showed resistivities similar to those of sintered values, $5 \times 10^6$–$10^8$ $\Omega$-cm. On the other hand, samples HIPed without oxygen-generating powder bed were much darker in their color, often close to black, showed a lower density of <99.8% T.D., and resistivities significantly lower than sintered values, for instance ~$5 \times 10^2$–$10^4$ $\Omega$-cm.

The HIPed samples showed a high Young's modulus of 270 GPa and high hardness of 15.3 GPa at 1 kgf load of Vickers indentation. The material is significantly stiffer and harder compared to values of Y-TZP based ESD safe ceramics: 200 GPa and 10 GPa, respectively. Therefore the abrasive wear resistance of this material should be significantly better than the Y-TZP based ESD safe ceramics.

EXAMPLE 4

The same material in Example 3 was formed into thin rods of 2 mm diameter by the hot wax extrusion. First, the mixture of AZ93 and $Fe_2O_3$ powder was further mixed with wax at high temperature. The extruded rods were sintered in air at 1275° C. to ~97% T.D. The sintered rods were further HIPed with oxygen-generating powder bed at 1250° C. and 207 MPa of argon. The HIPed rods were red in color, non-magnetic, and high density of >99.8% T.D. The resistivity of HIPed rods remained approximately same as sintered rods to $5 \times 10^7$ $\Omega$-cm.

EXAMPLE 5

The HIPed rods of Example 4 were machined into wire bonding tips. The material has a significantly higher Young's modulus of 270 GPa and Vickers hardness of 15.3 GPa at an indentation load of 1 kgf compared to Y-TZP based ESD safe ceramics. The material is advantageous for an effective ultrasonic bonding and improved wear resistance.

EXAMPLE 6

The oxygen generating powder is reduced during the HIPing. In particular the used $Pr_6O_{11}$ shows a lighter color after oxygen depletion. The used powder can be heat treated in air at 800–1,000° C. for 5 hr to reoxidize it back to $Pr_6O_{11}$. Therefore, the oxygen-generating powder can be easily regenerated for repeated use in processing additional ESD safe components.

EXAMPLE 7

Silicon carbide (SiC) crucible is often more durable for industrial applications with good hot strength and thermal conductivity. A SiC crucible available from Saint-Gobain Industrial Ceramics of Worcester, Mass., was used in a HIPing by the same method as Example 1. After HIPing it was found that the HIPed samples were dark, rather magnetic, and showed a lower resistivity. The crucible was passivated by heating in air at 1,000° C. for 5 hr to form an oxide layer. The same cycle was repeated with the passivated crucible. The HIPed samples from the passivated crucibles were then found to have essentially the same properties as samples processed using alumina crucibles. It is suspected that the oxygen may be consumed in the virgin SiC crucible during the HIPing creating a reducing environment.

EXAMPLE 8

A ZTA (AZ93 available from Saint-Gobain Ceramics & Plastics in Colorado Springs, Colo.) was mixed with milled $Fe_2O_3$ powder (milled to a specific surface area of 13 $m^2/g$, Alpha Asaer) in water by milling with zirconia (Y-TZP) milling media, followed by spray drying. The spray-dried powder was pressed into rectangular tiles using a steel mold followed by CIPing at 207 MPa to a green density ~55% T.D.

The CIPed tiles was sintered at 1250° C. for 1 hr in air to a sintered density of ~98% T.D. The color of sintered tiles was red. The tiles were not attracted to a permanent magnet. The resistivity of material by the DC resistivity measurement was ~$5 \times 10^7$ Ω-cm, which is good for the ESD dissipation.

Sintered samples were HIPed in alumina crucibles filled with zirconia bubbles. The HIPing was performed at 1200° C. in argon pressure of 207 MPa with graphite heating elements.

The HIPed tiles were machined into MOR bars for 4-point bending test according to ASTM C1161-02b resulting in an average strength of 877 MPa with the maximum strength of 1,023 MPa. The fracture toughness was measured by the indentation strength method to have superior values than those of alumina. The measured strength is significantly higher than those by sintering only (without pressure). Therefore, it is expected the HIPed material is advantageous for the grinding of complex shapes and low particle generation with an extended use.

The present results, particularly in connection with Examples 3–7, indicate that ceramics with thermochemically reducing compositions can be HIPed in a reducing atmosphere in a crucible having an oxygen-rich environment, such as an oxygen-generating feature such as a powder bed. The use of present HIPing technique is not limited to ESD safe ceramics having transition metal oxides as a resistivity modifier. For instance, a number of ceramics such as ferrites, varistors (including metal oxide varistors (MOVs)), $CeO_2$, $TiO_2$, Ce-TZP, PZT (PbO—ZrO2—TiO3), PMN (PbO—MnO—NbO3), PLZT, $BaTiO_3$, $SrTiO_3$, etc. can be safely HIPed for desired electromagnetic properties along with improved mechanical reliability.

Further, some ceramics are difficult to sinter due to higher vapor pressure in non-oxidative atmosphere. Such ceramics can be HIPed to near theoretical density by the foregoing HIPing process.

EXAMPLE 9

A ZTA (AZ93 available from Saint-Gobain Ceramics & Plastics in Colorado Springs, Colo., 40 vol % Y-TZP, 60 vol % $Al_2O_3$) was mixed with milled $Fe_2O_3$ powder (milled to a specific surface area of 13 $m^2/g$, Alpha Aesar of Ward Hill, Mass.) in water by milling with zirconia (Y-TZP) milling media, followed by spray drying. The spray dried powder was then used in a hot wax extrusion process to produce thin rods of 2 mm in diameter.

Then with heating cycles the wax was burned out and the rods are sintered in air at 1325C for 1 hr to a density ~97% T.D. The sintered rods were further HIPed with oxygen-generating powder bed at 1200° C. and 207 MPa of argon. The HIPed rods were red in color, non-magnetic, and high density of >99.8% T.D. The resistivity of HIPed rods remained approximately same as sintered rods to $5 \times 10^7$ Ω-cm.

The rods 1.6 mm in diameter and 25 mm were heat treated in an alumina tube furnace at 600C for 1 hr with a partial pressure of oxygen less than 100 ppm to a final resistivity of 2E5 Ohm.cm.

It has been shown that $PO_2$ can be used as control of the resistivity other than the soak temperature. A resistivity of 1.5E5 Ohm-cm is obtained with a heat treatment at 1000C for 60 minutes under a pressure of PO2~900 PPM

EXAMPLE 10

The resistivity of the material can be adjusted by how many charge carriers are frozen from the high temperature heat treatment. This is controlled by soak time and cooling rate. For example surface resistance of $ZTA/Fe_2O_3$ composition sintered in air can vary from 1E9 to 5E7 Ohm-cm by varying the cooling rate from 0.5C/min to 10C/min from the sintering temperature 1250 C to the room temperature.

As a further variant, the same material can be heat treated at resistivity as low as 7E3 Ohm.cm at 1000C for 1 hr at a $PO_2$ lower than 100 ppm for application requiring high conductivity such as ionizer tip for air ionizer system. Higher temperature and lower $PO_2$ transform the $Fe_2O_3$ phase into the Fe3O4 phase leading to even lower resistivity >5E3 Ohm.cm but with residual magnetic properties and the part would turn black in color.

EXAMPLE 11

A ZTA (AZ93 available from Saint-Gobain Ceramics & Plastics in Colorado Springs, Colo., 40 vol % Y-TZP, 60 vol % $Al_2O_3$) was mixed with milled $Fe_2O_3$ powder (milled to a specific surface area of 13 $m^2/g$, Alpha Aesar of Ward Hill, Mass.) in water by milling with zirconia (Y-TZP) milling media, followed by spray drying. The spray dried powder was then used in a hot wax extrusion process to produce thin rods of 2 mm in diameter.

Then, with heating cycles the wax was burned out and the rods were sintered in air at 1325C for 1 hr to a density ~97% T.D. The sintered rods were further HIPed with oxygen-generating powder bed at 1250° C. and 207 MPa of argon. The HIPed rods were red in color, non-magnetic, and high density of >99.8% T.D. The resistivity of HIPed rods remained approximately the same as sintered rods to $5 \times 10^7$ $\Omega$-cm.

EXAMPLE 12

A ZTA (AZ93 available from Saint-Gobain Ceramics & Plastics in Colorado Springs, Colo., 40 vol % Y-TZP, 60 vol % $Al_2O_3$) was mixed with milled $Fe_2O_3$ powder (milled to a specific surface area of 13 $m^2/g$, Alpha Aesar of Ward Hill, Mass.) in water by milling with zirconia (Y-TZP) milling media, followed by spray drying. The spray-dried powder was pressed into round pellets using a steel mold followed by CIPing at 207 MPa to a green density ~55% T.D.

The CIPed samples were sintered at 1250° C. for 1 hr in air to a sintered density of ~98% T.D.

The sintered samples were further HIPed with oxygen-generating powder bed at 1250° C. and 207 MPa of argon. The HIPed rods were red in color (non-black), non-magnetic, and high density of >99.8% T.D.

2 samples of 2 different batches of powders were prepared. Sample 1 showed a volume resistivity measured by the DC 2 point technique of 6.2E7 Ohm. cm. Sample 2 showed a volume resistivity measured by the DC 2 points technique of 1.2E8 Ohm.cm.

Color was measured with a MiniScan XE plus from Hunter lab in the L*a*b* system.

| Sample | Color | L* | Magnetism |
|---|---|---|---|
| 1 | Sintered in air | red | 40 | No |
| 2 | Hipped with powder bed | brown | 38 | No |
| 3 | 2 + heat treatment in air | red | 41 | No |
| 4 | Hipped without powder bed | black | 31 | Yes |

EXAMPLE 13

A ZTA (AZ93 available from Saint-Gobain Ceramics & Plastics in Colorado Springs, Colo., 40 vol % Y-TZP, 60 vol % $Al_2O_3$) was mixed with milled $Fe_2O_3$ powder (milled to a specific surface area of 13 $m^2/g$, Alpha Aesar of Ward Hill, Mass.) in water by milling with zirconia (Y-TZP) milling media, followed by spray drying. The spray-dried powder was pressed into round pellets using a steel mold followed by CIPing at 207 MPa to a green density ~55% T.D.

The CIPed samples were sintered at 1250° C. for 1 hr in air to a sintered density of ~98% T.D.

The sintered samples were further HIPed with an oxygen-generating powder bed at 1250° C. and 207 MPa of argon. The HIPed rods were red in color, non-magnetic, and high density of >99.8% T.D. The resistivity of material by the DC resistivity measurement was ~$5 \times 10^7$ $\Omega$-cm, which is good for the ESD dissipation.

A magnetic hysteresis curve was measured with a vibrating magnetometer: residual magnetic induction (Mr) of 5.8 Gauss, a coercive magnetic field (Hc) of 3.7 E4 A/m, and a maximum induction of 31.7 Gauss at a magnetic field of 9.5 E5 A/m.

EXAMPLE 14

A ZTA (AZ93 available from Saint-Gobain Ceramics & Plastics in Colorado Springs, Colo., 40 vol % Y-TZP, 60 vol % $Al_2O_3$) was mixed with milled $Fe_2O_3$ powder (milled to a specific surface area of 13 $m^2/g$, Alpha Aesar of Ward Hill, Mass.) in water by milling with zirconia (Y-TZP) milling media, followed by spray drying. The spray dried powder was then used in a hot wax extrusion process to produce thin rods of 2 mm in diameter.

Then, with heating cycles the wax is burned out and the rods are sintered in air at 1325C for 1 hr to a density ~97% T.D. The sintered rods were further HIPed with oxygen-generating powder bed at 1250° C. and 207 MPa of argon. The HIPed rods were red in color, non-magnetic, and high density of >99.8% T.D. The resistivity of HIPed rods remained approximately same as sintered rods to $5 \times 10^7$ $\Omega$-cm.

Then, rods 1.6 mm in diameter and 25 mm long were heat treated in an alumina tube under various temperatures and partial pressures of oxygen. This heat treatment permitted adjustment of the volume resistivity within a range from E4 to E8 Ohm.cm.

To measure the capacity of this material to softly dissipate static charges, the rods were in contact on one side with a 20 pf aluminum plate charged at 1000V (Ion Systems Charged Plate Monitor Model 210 CPM) and ground by a metal contact (brass) on the other side. The plate voltage decrease was measured over time with a high frequency oscilloscope at 25 MHz (LeCroy 9310AM Dual 400 MHz Oscilloscope). The decay time was taken as the time for the voltage of the plate to decrease from 900 V to 100 V.

| Sample | Volume resistivity (Ohm · cm) | Decay time (ms) |
|---|---|---|
| 2 | 10E4 | 20.7 |
| 3 | 10E5 | 20.8 |
| 4 | 10E6 | 39.6 |
| 5 | 10E7 | 110.0 |

The foregoing results are desirable, falling with target decay time between 10 and 500 ms. According to one feature, the ESD safe component, such as in the form of a bonding tool has a ESD safe characteristic such that a 1000V on the device with which it is in contact (such as a microelectronic device undergoing bonding operations) is dissipated to about 100 V in less than 500 ms.

Figure 2:
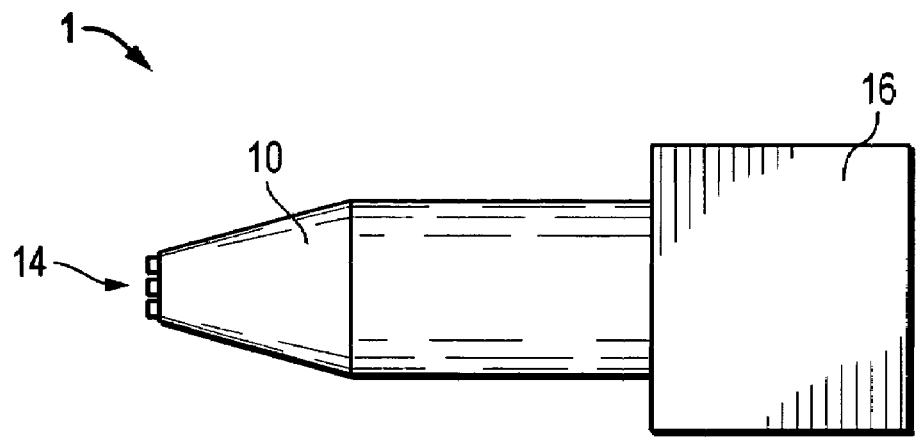
FIG. 2 shows a side view of the bonding tool, including an ultrasonic generator for effecting bonding operations.

Turning to the drawings, various embodiments are illustrated. As shown in FIGS. 1 and 2, a bonding tool 1 having a bonding tip 10 is formed of ZTA-based ESD safe ceramic materials as described herein. The bonding tip 10 having a generally cylindrical base portion and a conical tip portion is formed from sintered and HIPed rod stock having desirable ESD safe properties. The bonding tip 10 may be formed of a monolithic ceramic-based composition as described herein. The working end 14 is textured for gripping a work piece and for superior transfer of ultrasonic energy to the work piece for better bonding. Typically, the workpiece is a wire that is to be bonded to a contact pad in a microelectronic device. The bonding tool is used in a known manner and generally includes an ultrasonic source 16 coupled thereto for generating ultrasonic vibrations. In use, the working end 14 is placed in contact with and biased against the work piece, and the ultrasonic generator is engaged so as to impart the vibrations onto the work piece. By mechanical agitation via the ultrasonic waves and optionally with aid of thermal treatment, bonding of the work piece is carried out. In the case of wire bonding, the wire is deformed mechanically and thermally so as to bond to an underlying contact pad.

Figure 3:
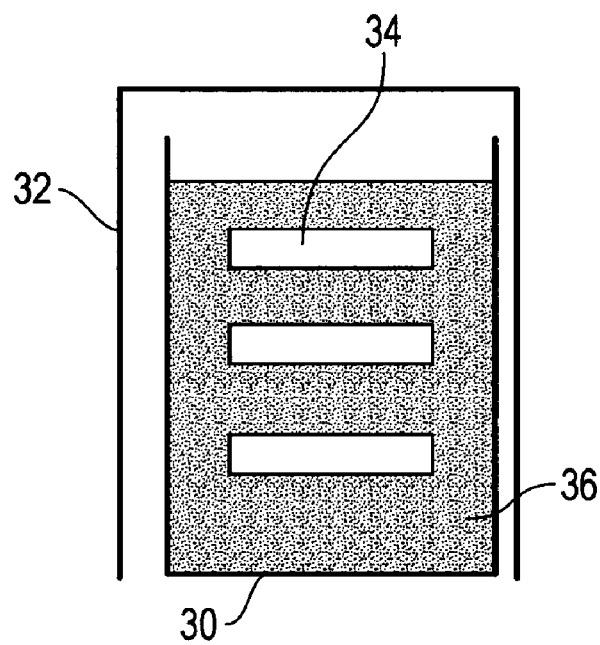
FIG. 3 illustrates a configuration of a crucible structure in which HIPing is carried out according to an embodiment of the present invention.

FIG. 3 illustrates a simple crucible structure for creation of a localized environment during HIPing as already described in detail above. Here, nested crucibles 30 and 32 are configured such that crucible 32 is inverted and placed over crucible 30. A singular annular opening is provided between the two crucibles around the bottom periphery of crucible 30. Here, crucible 30 contains ceramic components 34 embedded within processing gas source in the form of a powder bed.

Figure 4:
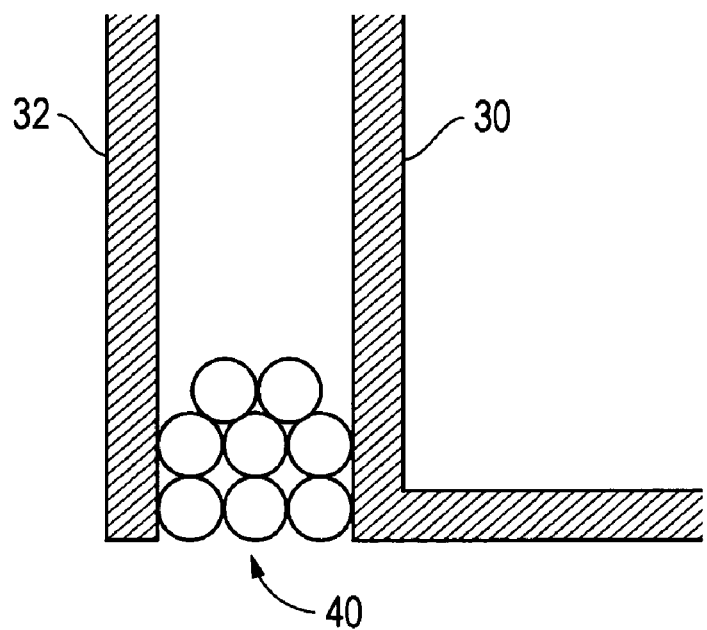
FIG. 4 illustrates an exploded cross-sectional view of the crucible structure shown in FIG. 3, additionally containing gettering materials.

FIG. 4 illustrates a variation on the crucible structure. Gettering agent 40 is provided between the crucibles, through which the processing gas would escape into the HIPing environment. The guttering agent is as described above, and generally attenuates the escape of the processing gas into the HIPing environment. Here, the gettering agent 40 is a metal powder.

The above-disclosed subject matter is to be considered illustrative, and not restrictive and the appended claims are intended to cover all such modifications, enhancements, equivalents, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. An ESD safe ceramic component formed of a sintered composition comprising:
   a base material of a zirconia toughened alumina, comprising a primary component of $Al_2O_3$ and a secondary component comprising $ZrO_2$, wherein the ZrO2 comprises tetragonal $ZrO_2$, wherein The primary component of the base material is present in an amount greater than the secondary component; and
   a resistivity modifier to reduce an electrical resistivity of the base material, the resistivity modifier comprising a transition metal oxide in an amount within a range of about 5 to about 40 volume % with respect to the base material.

2. The ESD safe ceramic component of claim 1, wherein the resistivity modifier comprises a conductive particulate.

3. The ESD safe ceramic component of claim 1, wherein the transition metal oxide is selected from the group consisting of $Fe_2O_3$, $TiO_2$, and $MaO_2$.

4. The ESD safe ceramic component of claim 3, wherein the transition metal oxide is $Fe_2O_3$.

5. The ESD safe ceramic component of claim 1, wherein the base material comprises $Al_2O_3$ and $ZrO_2$ in a ratio not less than 55:45 based on volume percent.

6. The ESD safe ceramic component of claim 5, wherein said ratio is not less than 60:40.

7. The ESD safe ceramic component of claim 1, wherein the primary component forms a primary phase of the base material, and the secondary component forms a secondary phase that is dispersed within the primary phase.

8. The ESD safe ceramic component of claim 7, wherein the secondary component comprises mainly tetragonal $ZrO_2$.

9. The ESD safe ceramic component of claim 7, wherein the secondary component comprises at least 75 vol % tetragonal $ZrO_2$.

10. The ESD safe ceramic component of claim 9, wherein the secondary component comprises at least 85 vol % tetragonal $ZrO_2$.

11. The ESD safe ceramic component of claim 9, wherein the secondary component further includes at least one of cubic and monoclinic $ZrO_2$.

12. The ESD safe ceramic component of claim 1, wherein the $ZrO_2$ includes a stabilizer.

13. The ESD safe ceramic component of claim 12, wherein the stabilizer comprises at least on material from the group consisting of yttria, ceria, scandia.

14. The ESD safe ceramic component of claim 12, wherein the $ZrO_2$ is pre-alloyed with the stabilizer prior to sintering.

15. The ESD safe ceramic component of claim 1, wherein the ceramic has a Young's Modulus greater than about 230 GPa.

16. The ESD safe ceramic component of claim 1, wherein the component has a Vickers Hardness greater than about 13 GPa.

17. The ESD safe ceramic component of claim 1, wherein the component has a thermal expansion coefficient less than about $10.0 \times 10^{-6}$ $K^{-1}$.

18. The ESD safe ceramic component of claim 1, wherein the component has a density at least 98% of theoretical density.

19. The ESD safe ceramic component of claim 18, wherein the component has a density at least 99% of theoretical density.

20. The ESD safe ceramic component of claim 19, wherein the component has a density at least 99.5% of theoretical density.

21. The ESD safe ceramic component of claim 1, wherein the component has an average grain size less than about 1.0 µm.

22. The ESD safe ceramic component of claim 1, wherein the component is selected from a group consisting of wire bonding tips, wire bonding capillaries, magneto-resistive handling tools, substrates, carriers, slicing tools, dicing tools, de-gluing carrier tools, pick and place tools, semiconductor device packaging tools, single and two step probes, and test sockets.

23. The ESD safe ceramic component of claim 1, wherein the component has an L* greater than about 35.

24. The ESD safe ceramic component of claim 1, wherein the component has a coercive magnetic field Hc not greater than about 5 E4 A/m.

25. The ESD safe ceramic component of claim 1, wherein the component has a residual magnetic induction Mr of not greater than 10 Gauss.

26. An ESD safe ceramic component formed of a sintered composition comprising:
   a base material of a zirconia toughened alumina, comprising a primary component of $Al_2O_3$ and a security component comprising $ZrO_2$, comprises tetragonal ZrO$_2$, wherein the primary component of the base material is present in an amount greater than the secondary component; and a resistivity modifier to reduce an electrical resistivity of the base material, the resistivity modifier comprising a transition metal oxide in an amount within a range of about 5 to about 40 volume % with respect to the base material, wherein the component has a volume resistivity within a range of about $10^5$ to about $10^{11}$ ohm-cm.

27. The ESD safe ceramic component of claim 26, wherein the component has a volume resistivity within a range of about $10^6$ to about $10^9$ ohm-cm.

28. The ESD safe ceramic component of claim 26, wherein the resistivity modifier comprises a conductive particulate.

29. The ESD safe ceramic component of claim 26, wherein the transition metal oxide is selected from the group consisting of Fe$_{2O3}$, TiO$_2$, and MnO$_2$.

30. The ESD safe ceramic component of claim 29, wherein the transition metal oxide is Fe$_2$O$_3$.

31. The ESD safe ceramic component of claim 26, wherein the base material comprises Al$_2$O$_3$ and ZrO$_2$ in a ratio not less than 55:45 based on volume percent.

32. The ESD safe ceramic component of claim 31, wherein said ratio is not less than 60:40.

33. The ESD safe ceramic component of claim 26, wherein the primary component forms a primary phase of the base material, and the secondary component forms a secondary phase that is dispersed within the primary phase.

34. The ESD safe ceramic component of claim 33, wherein the secondary component comprises mainly tetragonal ZrO$_2$.

35. The ESD safe ceramic component of claim 34, wherein the secondary component comprises at least 75 vol % tetragonal ZrO2.

36. The ESD safe ceramic component of claim 35, wherein the secondary component comprises at least 85 vol % tetragonal ZrO2.

37. The ESD safe ceramic component of claim 34, wherein the secondary component further includes at least one of cubic and monoclinic ZrO$_2$.

38. The ESD safe ceramic component of claim 26, wherein the ZrO$_2$ includes a stabilizer.

39. The ESD safe ceramic component of claim 38, wherein the stabilizer comprises at least on material from the group consisting of yttria, ceria, scandia.

40. The ESD safe ceramic component of claim 38, wherein the ZrO$_2$ is pre-alloyed with the stabilizer prior to sintering.

41. The ESD safe ceramic component of claim 26, wherein the component has a Vickers Hardness greater than about 13 GPa.

42. The ESD safe ceramic component of claim 26, wherein the component has a thermal expansion coefficient less than about $10.0 \times 10^{-6} K^{-1}$.

43. The ESD safe ceramic component of claim 26, wherein the component has a density at least 98% of theoretical density.

44. The ESD safe ceramic component of claim 43, wherein the component has a density at least 99% of theoretical density.

45. The ESD safe ceramic component of claim 44, wherein the component has a density at least 99.5% of theoretical density.

46. The ESD safe ceramic component of claim 26, wherein the component has an average grain size less than about 1.0 µm.

47. The ESD safe ceramic component of claim 26, wherein the component is selected from a group consisting of wire bonding tips, wire bonding capillaries, magneto-resistive handling tools, substrates, carriers, slicing tools, dicing tools, de-gluing carrier tools, pick and place tools, semiconductor device packaging tools, single and two step probes, and test sockets.

48. The ESD safe ceramic component of claim 26, wherein the component has an L* greater than about 35.

49. The ESD safe ceramic component of claim 26, wherein the component has a coercive magnetic field Hc not greater than about 5 E4 A/m.

50. The ESD safe ceramic component of claim 26, wherein the component has a residual magnetic induction Mr of not greater than 10 Gauss.

51. An ESD safe ceramic bonding tool formed from a sintered composition comprising:

a base material of a zirconia toughened alumina, comprising a primary component of Al$_2$O$_3$ and a secondary component comprising ZrO$_2$, wherein the ZrO$_2$ comprises tetragonal ZrO$_2$, wherein the primary component of the base material is present in an amount greater than the secondary component; and a resistivity modifier to reduce an electrical resistivity of the base material, the resistivity modifier comprising a transition metal oxide, wherein the tool has a density not less than 98% of theoretical density, a volume resistivity within a range of about $10_6$ to about $10_9$ ohm-cm.

52. The tool of claim 51, bonding tool has a tip portion that is textured for gripping a workpiece.

53. The tool of claim 52, bonding tool further comprises an ultrasonic generator for vibrating the tip portion.

* * * * *

UNITED STATES PATENT AND TRADEMARK OFFICE
CERTIFICATE OF CORRECTION

PATENT NO.        : 7,247,588 B2                                  Page 1 of 1
APPLICATION NO.   : 10/720982
DATED             : July 24, 2007
INVENTOR(S)       : Oh-Hun Kwon et al.

It is certified that error appears in the above-identified patent and that said Letters Patent is hereby corrected as shown below:

Claim 1, line 5, "ZrO2" should be --$ZrO_2$--;
         line 6, "The" should be --the--.

Claim 3, line 3, "$MaO_2$" should be -- $MnO_2$--.

Claim 26, line 4, "security" should be --secondary--.

Claim 27, line 3, "$10^6$ to about $10^9$" should be --$10^6$ to about $10^9$--.

Claim 29, line 3, "$Fe_{2O3}$" should be --$Fe_2O_3$--.

Claim 35, line 3, "ZrO2" should be --$ZrO_2$--;

Claim 36, line 3, "ZrO2" should be --$ZrO_2$--;

Claim 51, lines 13 and 14, "$10_6$ to about $10_9$" should be --$10^6$ to about $10^9$--.

Signed and Sealed this

Thirtieth Day of October, 2007

JON W. DUDAS
*Director of the United States Patent and Trademark Office*